US012748471B2

(12) United States Patent
Krithivasan et al.

(10) Patent No.: US 12,748,471 B2
(45) Date of Patent: Sep. 29, 2026

(54) VOLTAGE REGULATING MODULE DESIGN FOR THE USE OF UNDERFILL

(71) Applicant: Tesla, Inc., Austin, TX (US)

(72) Inventors: Vijaykumar Krithivasan, Mountain View, CA (US); Samuel Lichy, San Jose, CA (US); Yong guo Li, Gilroy, CA (US)

(73) Assignee: Tesla, Inc., Austin, TX (US)

( * ) Notice: Subject to any disclaimer, the term of this patent is extended or adjusted under 35 U.S.C. 154(b) by 445 days.

(21) Appl. No.: 18/260,216

(22) PCT Filed: Jan. 20, 2022

(86) PCT No.: PCT/US2022/013175
§ 371 (c)(1),
(2) Date: Jun. 30, 2023

(87) PCT Pub. No.: WO2022/159613
PCT Pub. Date: Jul. 28, 2022

(65) Prior Publication Data

US 2024/0061482 A1 Feb. 22, 2024

Related U.S. Application Data

(60) Provisional application No. 63/140,547, filed on Jan. 22, 2021.

(51) Int. Cl.
*G06F 1/26* (2006.01)
*H10W 40/22* (2026.01)
(Continued)

(52) U.S. Cl.
CPC .............. *G06F 1/26* (2013.01); *H10W 40/22* (2026.01); *H10W 42/121* (2026.01); *H10W 90/00* (2026.01); *H10W 90/701* (2026.01)

(58) Field of Classification Search
CPC ........................................................ G06F 1/26
See application file for complete search history.

(56) References Cited

U.S. PATENT DOCUMENTS 10,887,982 B2 1/2021 Nasr et al.
11,122,678 B2 9/2021 Zhao et al.
(Continued)

FOREIGN PATENT DOCUMENTS

TW 202022954 6/2020
WO WO 2020/061330 3/2020
(Continued)

OTHER PUBLICATIONS

International Search Report and Written Opinion dated Jul. 1, 2022 in application No. PCT/US2022/013175.

*Primary Examiner* — Brent A. Fairbanks
*Assistant Examiner* — Krishna J Palaniswamy
(74) *Attorney, Agent, or Firm* — Knobbe, Martens, Olson & Bear, LLP

(57) ABSTRACT

A voltage regulating module design is provided. In one aspect, a voltage regulating module (VRM) includes a first layer configured to output a regulated voltage that is based on a stepped down voltage, and a second layer stacked with the first layer, and a plurality of contacts, such as a ball grid array (BGA), on the first layer. The second layer includes a plurality of active components configured to provide the stepped down voltage to the first layer. The first and second layers have overlapping recesses, and the recess of the first layer has a larger footprint than the recess of the second layer. A plurality of the VRMS can be arranged to form an opening including a counterbore. A faster, such as a bolt, can be positioned in the opening. The first layer can have a larger clearance from the fastener positioned in the opening than the second layer.

15 Claims, 9 Drawing Sheets

(51) Int. Cl.
*H10W 42/00* (2026.01)
*H10W 90/00* (2026.01)

(56) References Cited

U.S. PATENT DOCUMENTS

| | | | | |
|---|---|---|---|---|
| 11,894,770 | B2 | 2/2024 | Sun et al. | |
| 2001/0011772 | A1 | 8/2001 | Fukasawa et al. | |
| 2019/0123020 | A1 | 4/2019 | Yu et al. | |
| 2020/0105653 | A1 | 4/2020 | Elsherbini et al. | |
| 2020/0185304 | A1* | 6/2020 | Chiu | H10P 72/74 |
| 2020/0194393 | A1* | 6/2020 | Wu | H10P 72/74 |
| 2020/0211922 | A1 | 7/2020 | Chun et al. | |
| 2020/0221568 | A1 | 7/2020 | Zhao et al. | |
| 2020/0266705 | A1 | 8/2020 | Sun et al. | |

FOREIGN PATENT DOCUMENTS

| | | | | |
|---|---|---|---|---|
| WO | WO-2020061330 | A1 * | 3/2020 | H10W 90/00 |
| WO | WO 22/133448 | | 6/2022 | |

* cited by examiner

VOLTAGE REGULATING MODULE DESIGN FOR THE USE OF UNDERFILL

CROSS-REFERENCE TO RELATED APPLICATION

This application is a U.S. national phase application under 35 U.S.C. § 371 of International Application No. PCT/US2022/013175, filed Jan. 20, 2022, which claims the benefit of U.S. Provisional Patent Application No. 63/140,547, titled "VOLTAGE REGULATING MODULE DESIGN FOR UNDERFILL," filed Jan. 22, 2021, the disclosures of each which are incorporated herein by reference in their entireties and for all purposes.

BACKGROUND

Technical Field

The present disclosure relates generally to electronics, and more specifically to voltage regulating modules (VRMs).

Description of the Related Technology

Multi-chip modules can include a plurality of application-specific integrated circuit (ASIC) devices and a plurality of VRMs configured to provide power to each of the ASICs. A given VRM may be electrically coupled to one of the ASIC devices via a ball grid array (BGA). The BGA may be encapsulated using underfill in order to protect the BGA.

SUMMARY OF CERTAIN INVENTIVE ASPECTS

In one aspect, there is provided a voltage regulating module (VRM), comprising: a first layer configured to output a regulated voltage that is based on a stepped down voltage, the first layer having a first recess; a second layer stacked with the first layer, the second layer comprising a plurality of active components configured to receive a voltage, generate the stepped down voltage based on the voltage, and provide the stepped down voltage to the first layer, the second layer having a second recess that overlaps with the first recess, the first recess having a larger footprint than the second recess; and a plurality of contacts on the first layer and configured to output the regulated voltage.

The plurality of contacts can include a ball grid array.

The ball grid array can be encapsulated with an underfill.

The VRM can further comprise a third layer stacked with the first and second layers, the third layer can comprise plurality of active components.

The third layer can have a third recess having an area that is substantially the area of the second recess.

The first layer can comprise a plurality of discrete components configured to multiply the current of the stepped down voltage.

The discrete components can comprise passive circuit elements.

In another aspect, there is provided a multi-chip module, comprising: a plurality of integrated circuit (IC) dies; an array of voltage regulating modules (VRMs), wherein the array of VRMs is arranged such that there is an opening including a counterbore between a group of adjacent VRMs of the array of VRMs, and wherein each VRM of the VRMs is stacked with a respective IC die of the plurality of IC dies;

and a fastener located in the opening between the group of adjacent VRMs of the array of VRMs.

Each of the VRMs of the array of VRMs can include a ball grid array encapsulated in an underfill.

The each of the VRMs of the group of VRMs can have a first layer and the second layer, wherein the first layer has a larger clearance from the fastener than the second layer, and wherein the first layer includes passive components and the second layer includes active components.

In yet another aspect, a multi-chip module, comprising: a plurality of integrated circuit (IC) dies; a plurality of voltage regulating modules (VRMs), wherein each VRM of the VRMs is stacked with a respective IC die of the plurality of IC dies; and a plurality of fasteners located in openings between VRMs of the plurality of VRMs; wherein a first VRM of the plurality of VRMs comprises: a first layer configured to output a regulated voltage that is based on a stepped down voltage, the first layer having a first recess; a second layer stacked with the first layer, the second layer comprising a plurality of active components configured to receive a voltage and provide the stepped down voltage to the first layer, the second layer having a second recess that overlaps with the first recess, the first layer having a larger clearance from a first fastener of the plurality of fasteners than the second layer, the first fastener being located in a first opening of the openings, the first opening being at least partly defined by the first recess and the second recess; and a plurality of contacts on the first layer and electrically connected to a first IC die of the plurality of IC dies that is stacked with the first VRM, the plurality of contacts configured to provide the regulated voltage to the first IC die.

The plurality of contacts can include a ball grid array.

The ball grid array can be encapsulated with an underfill.

The clearance of the first layer can be configured to impede or prevent the underfill from clogging the first recess.

The underfill can form a fillet that extends from an edge of the first layer towards the fastener.

A distance that the fillet extends from the edge of the first layer towards the fastener can be less than a distance between the clearance of the first layer and the clearance of the second layer.

The first layer can comprise a plurality of passive circuit elements configured to multiply the current of the stepped down voltage.

The fasteners can comprise bolts.

The multi-chip module can further comprise a cooling system configured to actively cool the VRMs.

A system on wafer (SoW) can include the IC dies.

The multi-chip module can further comprise a thermal dissipation structure formed a side of the SoW opposing the first and second layers.

BRIEF DESCRIPTION OF THE DRAWINGS

FIGS. 2A and 2B, FIGS. 4A and 4B illustrate a partial plan view of a VRM including a recess for a bolt accordance with aspects of this disclosure.

DETAILED DESCRIPTION OF CERTAIN EMBODIMENTS

Figure 1:
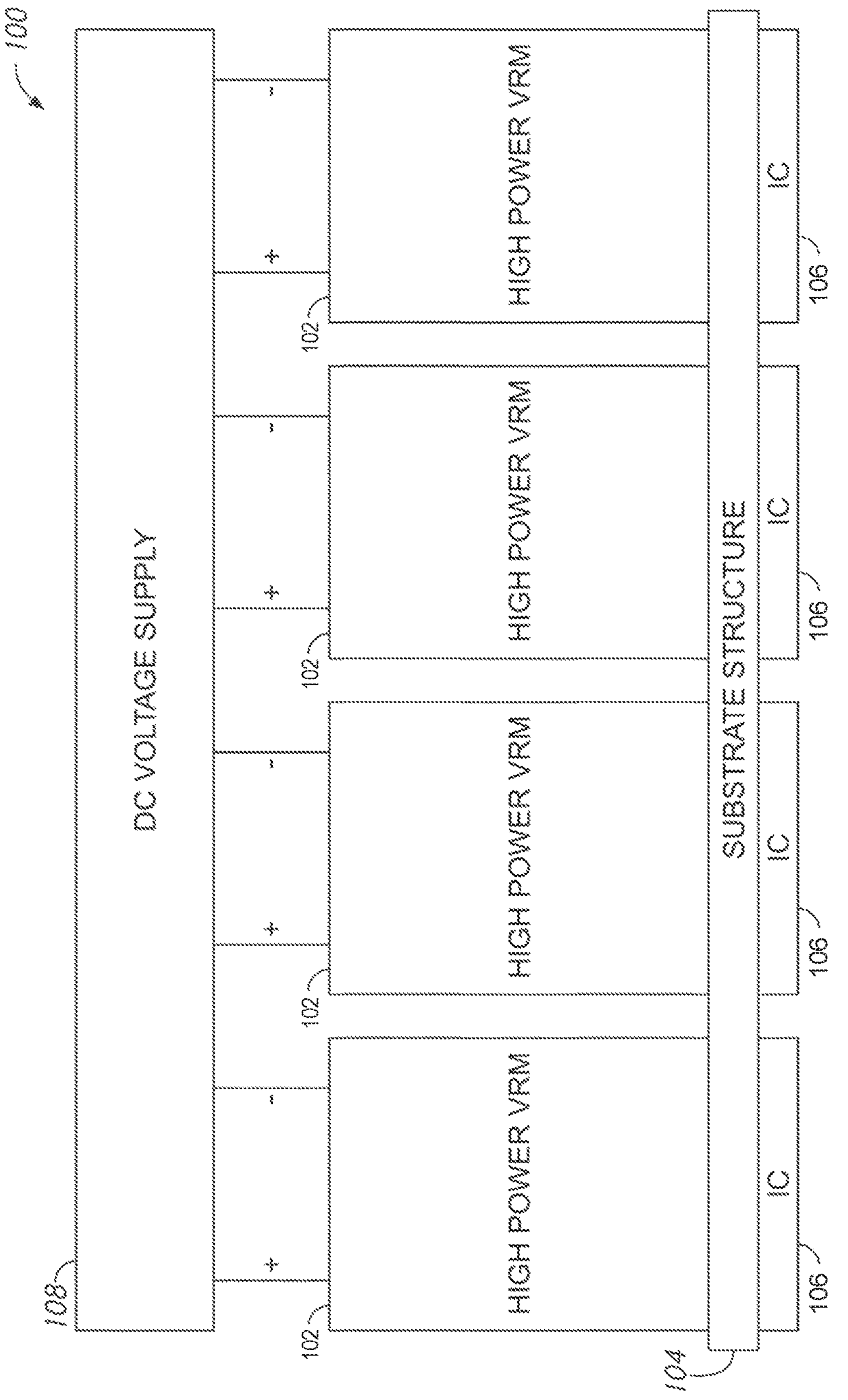
FIG. 1 is a sectional side view block diagram illustrating one embodiment of a multi-chip module constructed according to aspects of this disclosure.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or terms can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In certain implementations, the mechanical architecture of a system on a substrate involves a high density packing of voltage regulating modules (VRMs) on the substrate, in addition to a plurality of application-specific integrated circuit (ASIC) devices. There are a number of design trade-offs and/or challenges that affect the size, layout, density, spacing, and the like of the VRMs on the substrate. One particular challenge relates to allocating space within the VRM internal layers for active and passive components, shoulder bolts for fastening the VRM to the substrate, and underfill. This disclosure provides technical solutions to such a challenge.

Aspects of this disclosure relate to a VRM design which has recessed areas on the bottom ball grid array (BGA) attaching layer of the VRM. Certain advantages to this design include helping to save physical space within the VRM layout so that the VRM can meet underfill and bolt clearance specifications, which are significant factors that enable backend assembly processes. In addition, aspects of this disclosure can also maintain the VIM internal layer space specifications, particularly for the active components, and the overall VRM packing density on the substrate is not significantly affected.

Previous generations of BGA type VRMs do not have a flexible design which can enable high packing densities. The manufacturing challenges are plentiful ranging from tool alignment and drill hole true position tolerances. In contrast, the designs according to aspects of this disclosure are unique and have not been used to solve the aforementioned challenges.

Aspects of this disclosure relate to a VRM architecture that can be integrated into products that involve backend assembly with relatively high packaging densities. The architecture can be integrated in products that are placed in close proximity. In certain implementations, the VRM can be formed of a material that can withstand machining to achieve dimensional stability. Non-limiting examples of materials which can be used for the VRM include: printed circuit boards (PCBs), organic substrates, and/or PCBs or organic substrates overmolded with an engineering mold compound. The VRM architecture can include a recessed counterbore feature that can improve component placement and/or enables backend assembly. The mechanical architecture of the VRM is one aspect that can affect the delivery of the power for enhanced and/or optimal ASIC performance. For example, a lower packing density of the VRMs can result in a significant degradation of the ASIC performance.

A VRM can include a plurality of layers including at least a first layer and a second layer. One or more of these layers can include active components, such as transistors. The active components can step down a received voltage and output a stepped down voltage. Another layer of the VRM can include passive components, such as capacitors and/or inductors. This layer can output a regulated voltage to electrical contacts, such as a ball grid array, thereon. The regulated voltage is based on the stepped down voltage.

The layer with passive components has a recess that overlaps with a recess of each of the one or more layers with active components. The recess of the layer with passive components can have a larger footprint than a corresponding recess of a layer with active components. Accordingly, the footprint of the recess of the layer with the passive components has a larger area over an underlying component than the footprint of the recess of a layer with active components. The recess of the layer with passive components can provide a larger clearance from a fastener, such as a bolt, positioned in an opening at least partly defined by the recesses in the layers of the VRM. An array of such VRMs can be included in a multi-Chip module. For example, VRMs can be stacked with and provide regulated voltages to respective ASICs. Openings for fasteners at least partly defined by recesses at corners of VRMs and between adjacent VRMs can each form a counterbore feature. For example, recesses at corners of 4 VRMs can define an opening. As another example, the recesses at corners of 4 VRMs and one or more intervening structures can define an opening. The layer of the VIM with passive components having a recess with larger fastener clearance can at least partly define the counterbore feature. With the counterbore feature, VRMs can be densely packed without sacrificing area of the one or more VRM layers that include active components.

Embodiments of this disclosure relate to VRM design for a multi-chip module. In some embodiments, the multi-chip module can be mounted to a redistribution layer or Integrated Fan-Out (InFO) package of a system on a wafer (SoW). In one embodiment, the multi-chip module includes a modular direct-clamp structure that allows for mounting a plurality of ICs or sockets to be mounted onto and mechanically coupled to a thermal dissipation structure to thermally cool the integrated circuit (IC) dies in the multi-chip module. In one embodiment, the IC dies or sockets are mounted on an opposite side of the InFO substrate from the thermal dissipation structure.

The mounting of the multi-chip module to the InFO substrate and/or thermal dissipation structure may use a frame configured to hold a plurality of chips. For example, the frame may be sized and shaped to hold 2, 4, 6, 8, 10, 12 or more IC dies as described in more detail below. In yet other embodiments, 16, 25, or 36 IC dies may be help by the frame. In one embodiment, the frame is rectangular or square to surround each side of the IC die and provide a stable mounting system or means for the multi-chip module. At each corner of an IC die within the module may be a through hold in the frame to allow a mounting pin, screw, or other fastener to mount the frame to the substrate and cooling system. As shown in the figures, one or more corner clamps may be used to fasten the multi-chip module frame to the rest of the package.

FIG. 1 is a sectional side view illustrating a processing system 100 constructed according to aspects of this disclosure. The processing system 100 can be a multi-chip module. The processing system 100 of FIG. 1 includes a plurality of high power VRMs 102 that mount on a substrate structure 104. The VRMs 102 are fed by a direct current (DC) supply voltage 108, e.g., 40 volts, 48 volts, or another relatively high voltage, and respectively provide a regulated voltage a respective plurality of IC dies 106. In some embodiments, each of the plurality of VRMs 102 produces an output of approximately 0.8 volts and provides about 600 watts of power or more to the respective plurality of IC dies 106. However, aspects of this disclosure are not limited thereto and the VRMs 102 can produce an output within a range of approximately 0.6-1.3 volts, a range of 0.8-1.1 volts, or another suitable voltage range depending on the embodiment. Thus, in certain embodiments, each of the plurality of VRMs 102 produces in excess of about 100 amperes of current to the plurality of IC dies 106. In certain applications, the VRMs can provide current in a range from 400 amperes to 800 amperes to the plurality of IC dies 106.

Figure 2A:
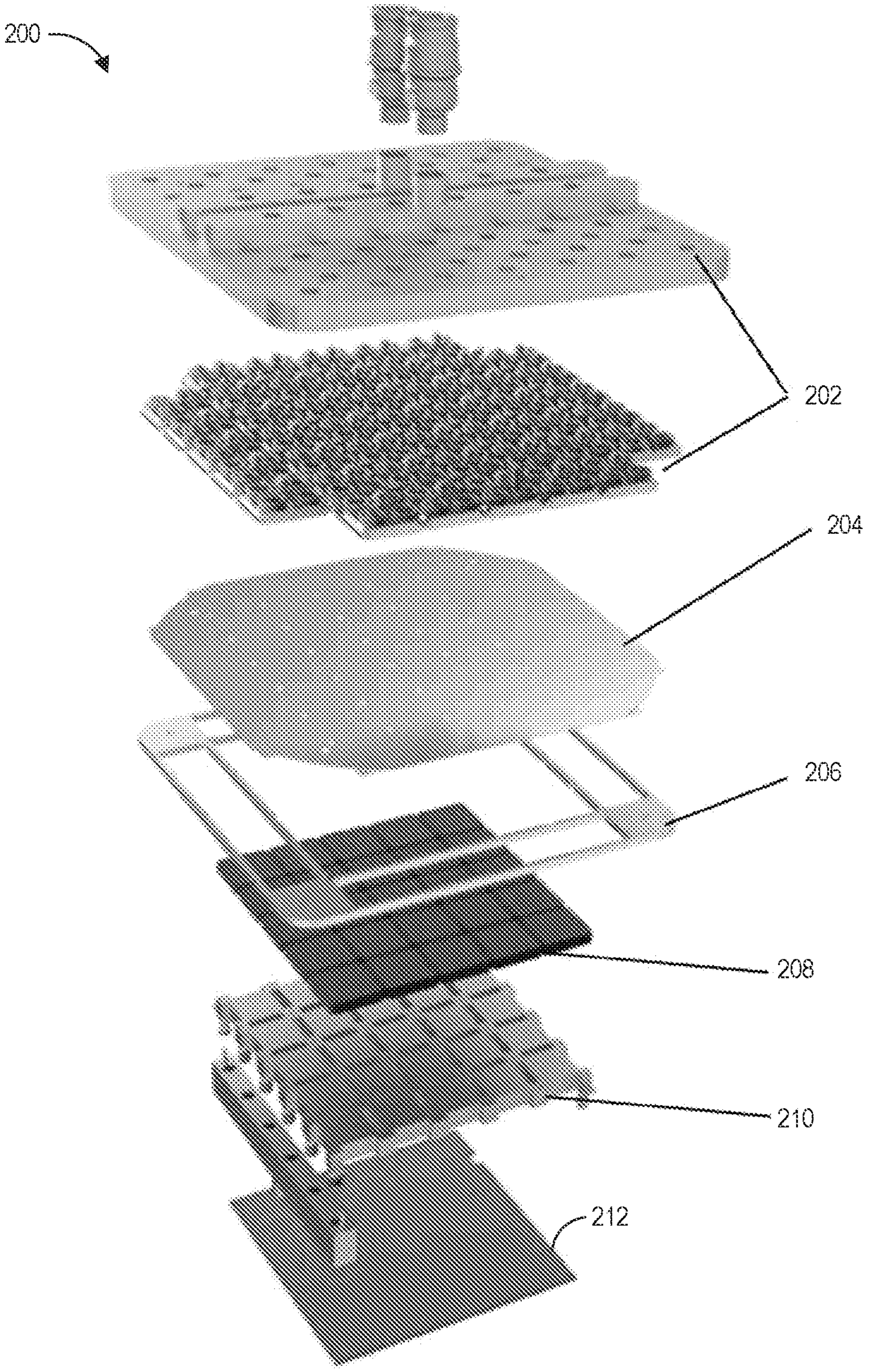
FIGS. 2A and 2B illustrate a processing system in accordance with aspects of this disclosure.
Figure 2B:
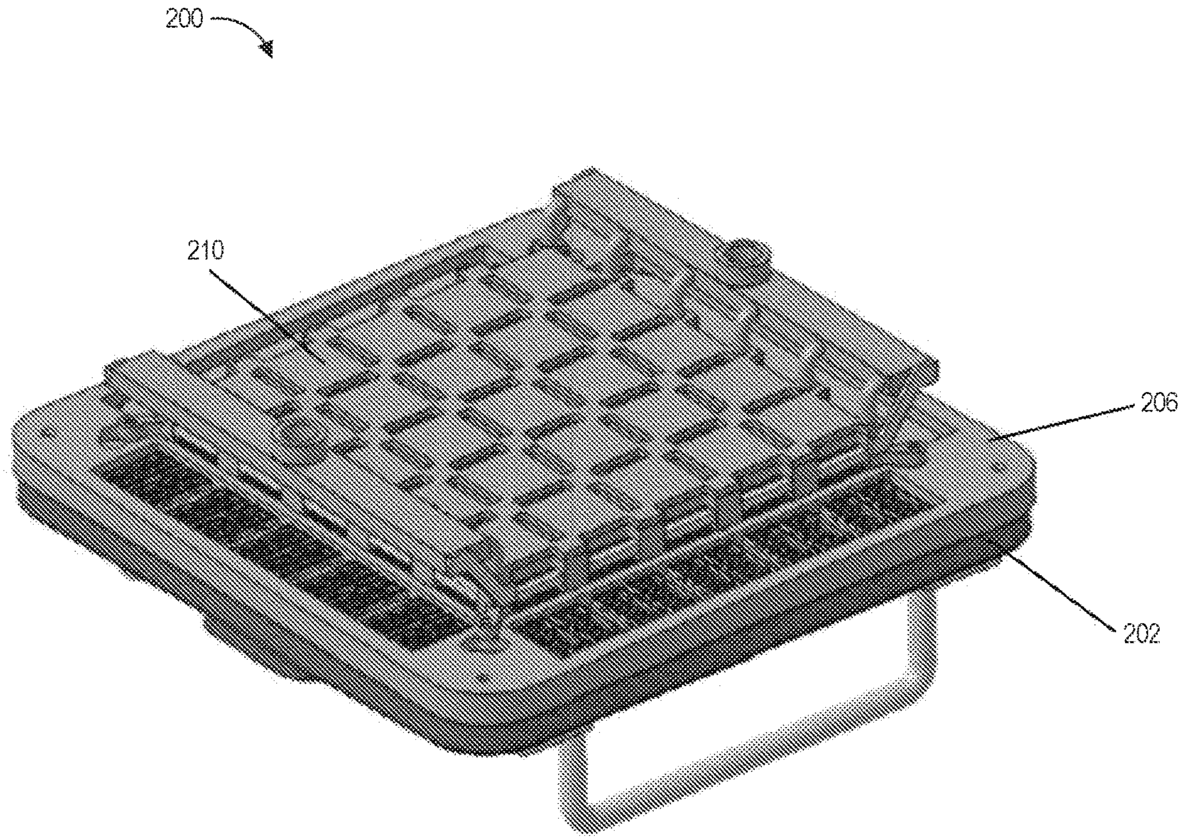

FIGS. 2A and 2B illustrate a processing system 200 in accordance with aspects of this disclosure. FIG. 2A is an exploded view of the processing system 200. FIG. 2B is an assembled view of the processing system 200, Features of this disclosure can be implemented in the processing system 200 and/or any other suitable processing system. The processing system 200 can have a high compute density and can dissipate heat generated by the processing system 200. The processing system 200 can execute trillions of operations per second in certain applications. The processing system 200 can be used in and/or specifically configured for high performance computing and/or computation intensive applications, such as neural network training and/or processing, machine learning, artificial intelligence, or the like. In an embodiment, the processing system 200 can be used for neural network training. The processing system 200 can implement redundancy. In some applications, the processing system 200 can be used for neural network training to generate data for use by an autopilot system of a vehicle (e.g., an automobile).

As illustrated in FIG. 2A, the processing system 200 includes a thermal dissipation structure 202, a SoW 204, an edge stiffener 206, VRMs 208, a cooling system 210, and a control broad 212. FIG. 2B shows the processing system 200 upside down relative to FIG. 2A. The processing system 200 is shown in FIG. 2B without the control board 212.

The thermal dissipation structure 202 can dissipate heat from the SoW 204. The thermal dissipation structure 202 can include a heat spreader. Such a heat spreader can include a metal plate. Alternatively or additionally, the thermal dissipation structure can include a heat sink. The thermal dissipation structure 202 can include metal, such as copper and/or aluminum. The thermal dissipation structure 202 can alternatively or additionally include any other suitable material with desirable heat dissipation properties. In certain applications, the thermal dissipation structure 202 can include a copper heat spreader and an aluminum heat sink. A thermal interface material can be included between the thermal dissipation structure 202 and the SoW 204 to reduce and/or minimize heat transfer resistance.

The SoW 204 can include an array of IC dies. The IC dies can be embedded in a molding material. The SoW 204 can have a high compute density. The IC dies can be semiconductor dies, such as silicon dies. The array of IC dies can include any suitable number of IC dies. For example, the array of IC dies can include 16 IC dies, 25 IC dies, 36 IC dies, or 49 IC dies. The SoW 204 can be an InFO wafer, for example. InFO wafers can include a plurality of routing layers over an array of IC dies. For example, an InFO wafer can include 4, 5, 6, 8, or 10 routing layers in certain applications. The routing layers of the InFO wafer can provide signal connectivity between the ICs dies and/or to external components. The SoW 204 can have a relatively large diameter, such as a diameter in a range from 10 inches to 15 inches. As one example, the SoW 204 can have a 12 inch diameter.

The edge stiffener 206 can contribute to the structural integrity of the processing system 200. The edge stiffener 206 can provide support to the VRMs 208 and keep the VRMs 208 in place.

The VRMs 208 can be positioned such that each VRM is stacked with an IC die of the SoW 204. In the processing system 200, there is high density packing of the VRMs 208. Accordingly, the VRMs 208 can consume significant power. The VRMs 208 are configured to receive a direct current (DC) supply voltage and supply a lower output voltage to a corresponding IC die of the SoW 204.

The cooling system 210 can provide active cooling for the VRMs 208. The cooling system 210 can provide active cooling for the control board 212. The cooling system 210 can include metal with flow paths for heat transfer fluid to flow through. As one example, the cooling system 210 can include machined metal, such as copper. The cooling system 210 can include brazed fin arrays for high cooling efficiency. In the assembled processing system 200, the cooling system 210 can be bolted to the thermal dissipation structure 202. This can provide structural support for the SoW 204 and/or can reduce the chance of the SoW 204 breaking. Thermal interface material can be included between the cooling system 210 and the control board 212 to reduce and/or minimize heat transfer resistance.

The control board 212 can include electrical components. Electronics of the control board 212 can provide control signals for the VRMs 208. The control board 212 can include electronics to control operation of the SoW 204.

Figure 3:
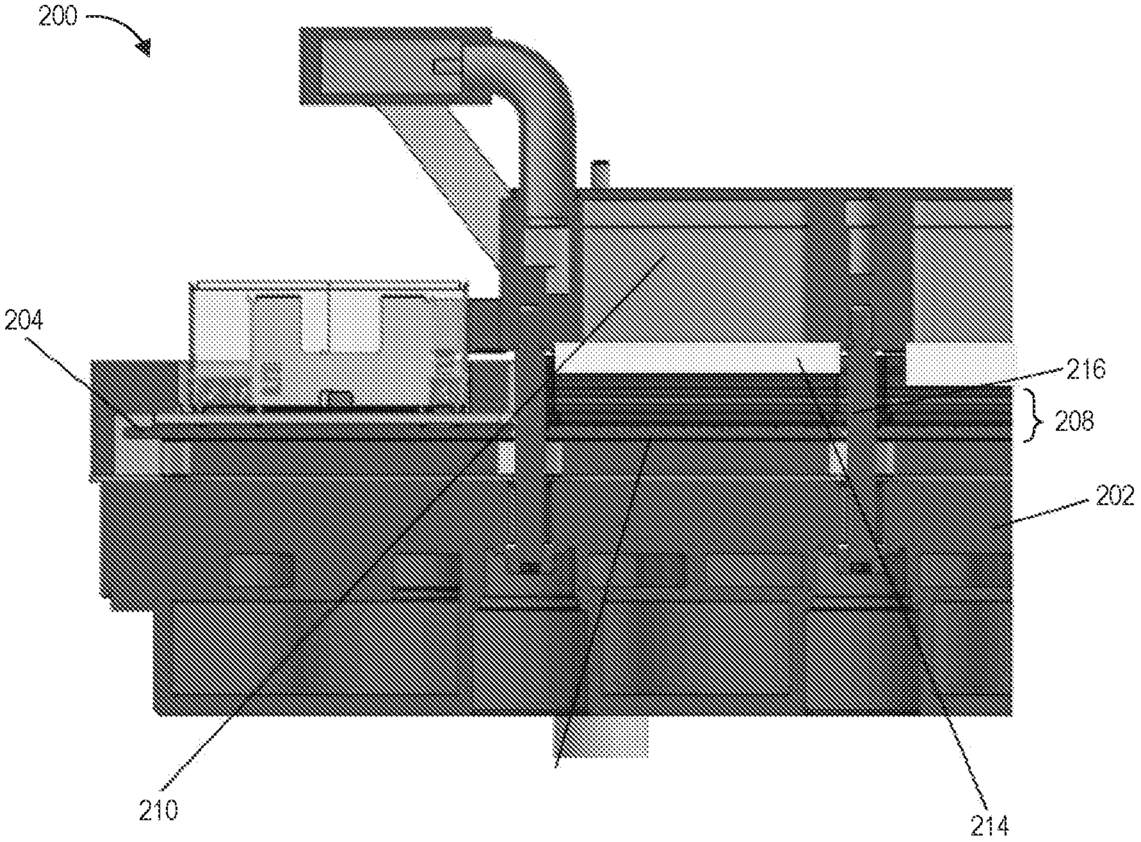
FIG. 3 is a partial cross-section view of the system on wafer u

FIG. 3 is a partial cross-section view of the SoW module 200 of FIGS. 2A and 2B, With reference to FIG. 3, the SoW module 200 includes the thermal dissipation structure 202, the SoW 204, the VRMs 208, and the cooling system 210. The SoW module 200 further includes a thermal interface structure 214 between the VRMs 208 and the cooling system 210, as well as a plurality of bolts 216 configured to fasten the VRMs 208 in place.

Figure 4A:
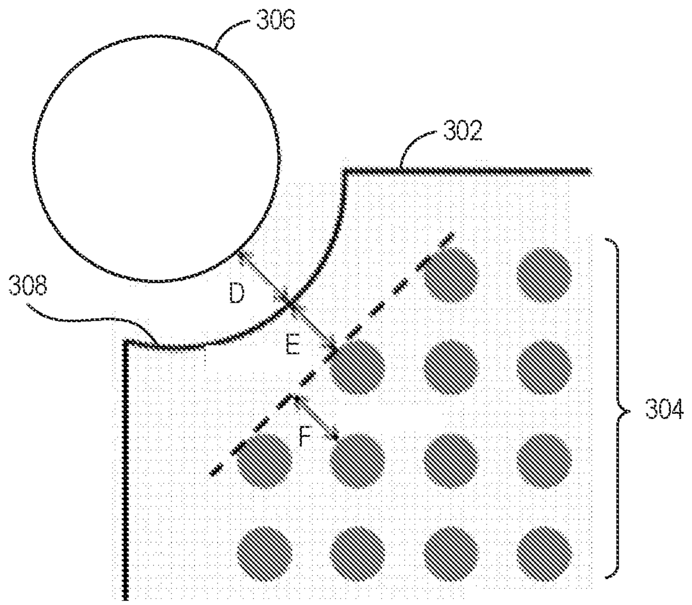
Figure 4B:
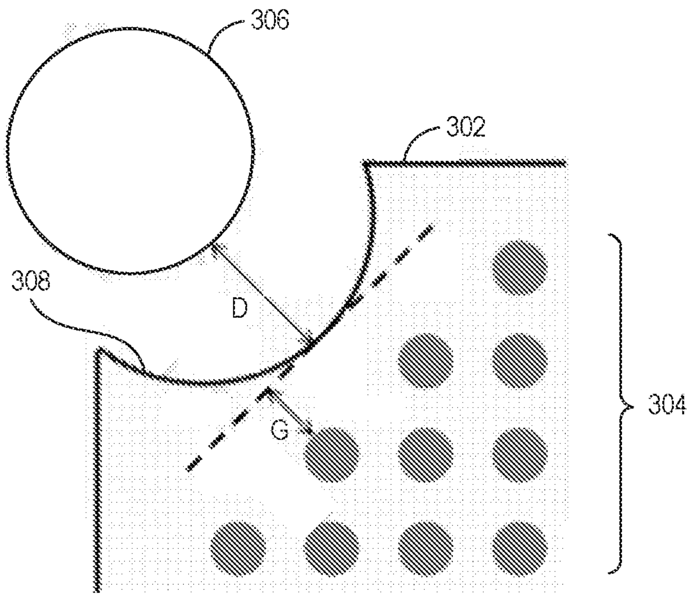
Figure 4C:
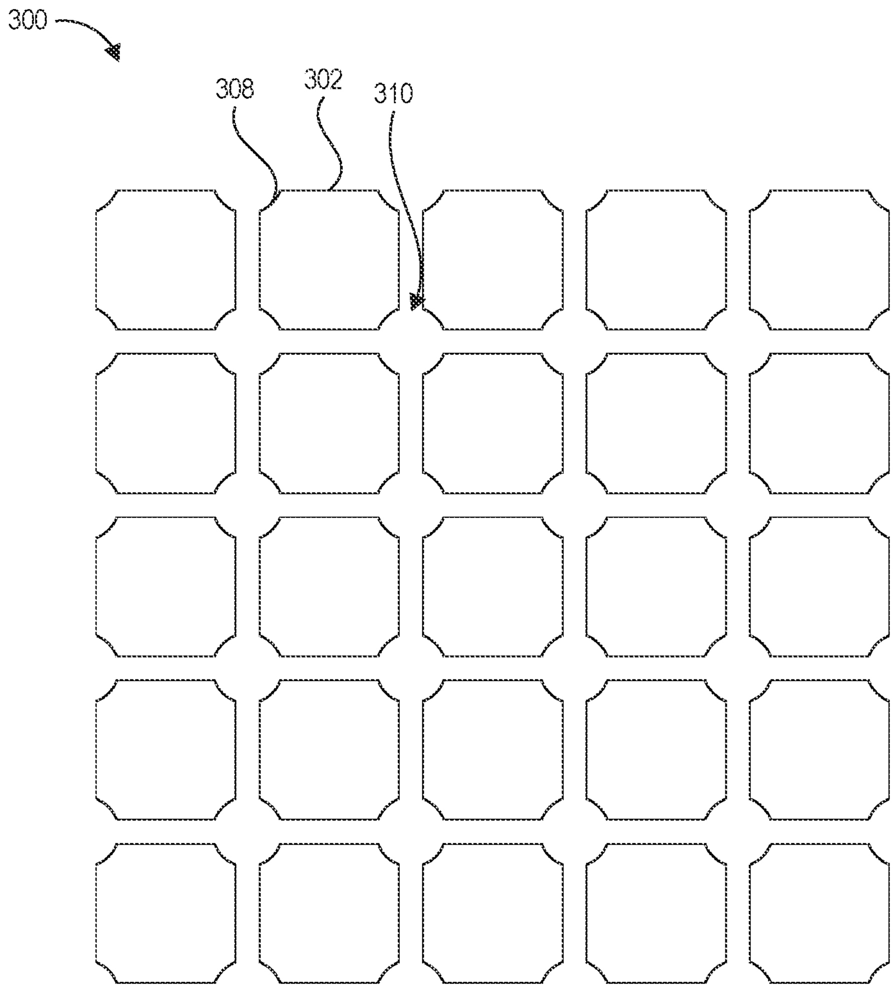
FIG. 4C illustrates a plan view of a plurality of VRMs arranged in an array in accordance with aspects of this disclosure.

FIGS. 4A and 4B illustrate a partial plan view of a VRM 302 including a recess 308 for a bolt 306 in accordance with aspects of this disclosure. FIG. 4C illustrates a plan view of a plurality of VRMs 302 arranged in an array 300 in accordance with aspects of this disclosure. As shown in FIG. 4C, the recesses 308 of four adjacent VRMs 302 may form a bolt hole 310 into which a bolt can be placed. The bolt hole 310 is at least partly defined by the recesses 308 of four VRMs 302 in FIG. 4C. The bolt hole 310 is an example of an opening at least partly defined by recesses 308 of VRMs 302. Such an opening can be formed by spaces between the recesses 308 of the VRMs 302. Such an opening can be formed by spaces between one or more intervening structures within the recesses 308 of the VRMs 302.

With reference to FIGS. 4A and 4B, the recess 308 defines a keep-out zone in order to provide clearance for inserting the bolt 306 adjacent to one or more VRM(s) 302 and securing the VRM(s) 302 in place. For example, the keep-out zone may be defined by a minimum distance or clearance D between an edge of the VRM 302 and the bolt 306. As illustrated, the bolt 306 can be a shoulder bolt. Any other suitable fastener can be used in place of a bolt.

As also shown in FIG. 4A, a BGA 304 is provided on one end of the VIM 302 to provide electrical connections to the SoW 204 (see EEGs, 2A-3). The BGA 304 may be spaced from an edge of the VRM 302 by a minimum distance or clearance E and may define a pitch F between balls in the BGA 304 in the diagonal direction as illustrated. As described above, the BGA 304 may be applied with an underfill configured to encapsulate the BGA 304 when installed onto the SoW 204 and provide structural support to the BGA 304 thereby preventing damage to the BGA 304. In one implementation, the clearance D may be about 600 μm, the clearance E may be about 500 μm, and the pitch F may be about 550 μm. However, in other embodiments, each of these distances may be larger or smaller.

There may be a number of competing design considerations that can affect the size of the keep-out zone defined by the clearance D between the bolt 306 and the edge of the VRM 302. For example, in order to protect the balls of the BGA 304 adjacent to the recess 308, the underfill may occupy a certain amount of space between the BGA 304 and the bolt 306. In some embodiments, the underfill may include a molding material or a polymer applied in a liquid form and solidified to encapsulate the BGA 304. If there is not sufficient space between edge of the VRM 302 and the bolt 306 (e.g., the keep-out zone or the clearance D), the underfill may clog the recess 308, which can make insertion of the bolt 306 through a bolt hole 310 formed by one or more recesses 308 challenging or not possible. In certain implementations, it may be specified to provide a keep-out zone defined by a clearance D of about 1.1 mm. The clearance D can be 1.1 mm+/− about 3%. The keep-out zone may be larger or smaller depending on the implementation.

One option for increasing the size of the keep-out zone is to provide additional spacing between adjacent VRMs 302. However, this can have the drawback of increasing the overall area occupied by the VRMs 302. For certain implementations, the area in which the VRMs 302 can be placed (e.g., within the edge stiffener 206) is fixed, and thus, the spacing between the VRMs 302 cannot be increased without reducing the size of the individual VRMs 302 or the number of VRMs 302 that can be included in the multi-chip module. For example, as shown in FIG. 4C, certain multi-chip modules may include an array of ASICs respectively coupled to VRMs 302. As illustrated, there are 25 ASICs and 25 VRMs in FIG. 4C. In order to maintain the size of the VRMs 302 and provide a large enough keep-out zone to prevent the underfill from dogging the recess 308, the number of ASICs and VRMs 302 may be reduced to 16 in a 4×4 array. This reduction will significantly affect the overall performance of the multi-chip module.

With reference to FIG. 4B, the size of keep-out zone can be increased by removing the row of three balls from the BGA 304 of FIG. 4A closest to the recess 308, thereby increasing the clearance D. However, reducing the size of the individual VRMs 302 or the number of VRMs 302 may be difficult or impractical without sacrificing some of the functionality of the VRMs 302. For instance, the components of the VRM 302 may be densely packed such that the components would not all fit within the reduced area of the VRM 302 for providing a large enough keep-out zone to avoid clogging of the recess 308 by the underfill. For example, reducing the size of the VRMs 302 or the number of the VRMs 302 can reduce the amount of power that can be delivered to the ASICs, leading to a reduction in the ASIC performance. In some implementations, the clearance D may be 1.1 mm+/−about 3% and the clearance F may be about 550 microns+/− about 20%.

Figure 5A:
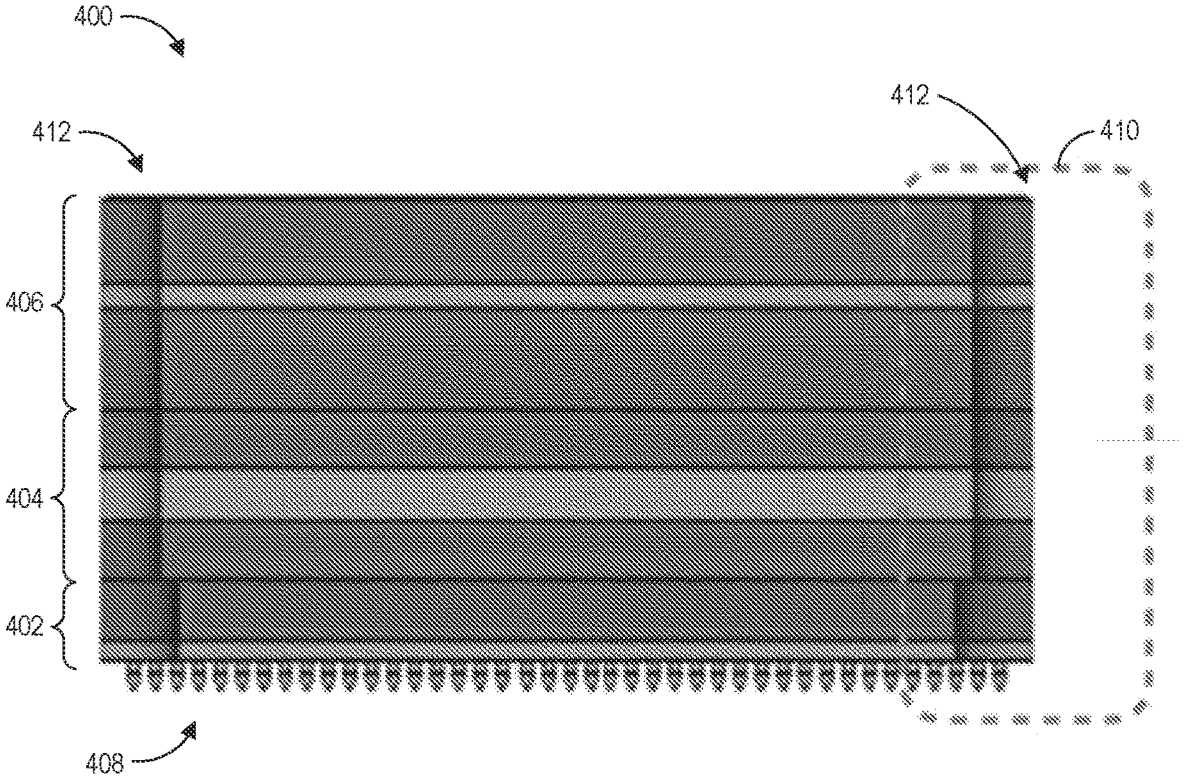
FIGS. 5A and 5B illustrate cross-sectional views of a VRM design for underfill in accordance with aspects of this disclosure.
Figure 5B:
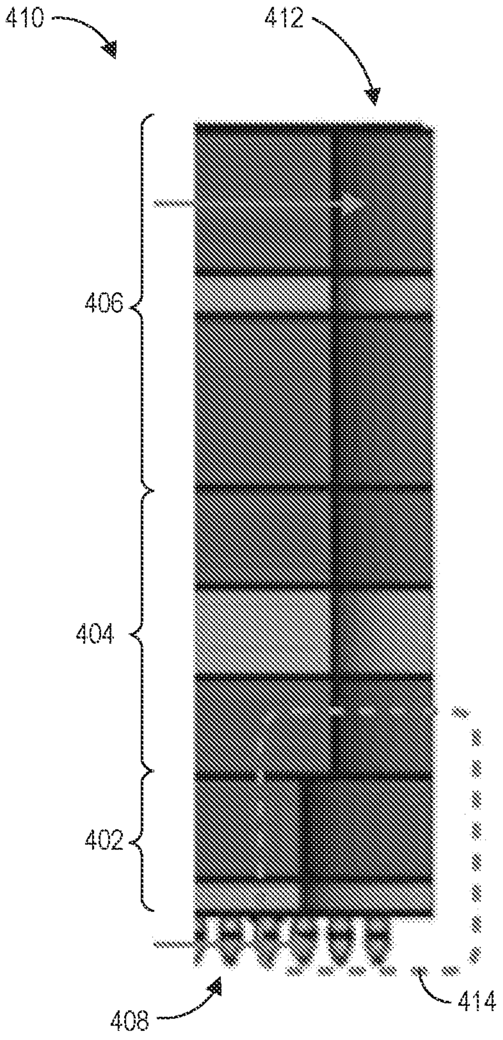

Aspects of this disclosure relate to a VRM 302 design which can impede or substantially prevent clogging of the recess 308 due to the underfill without increasing the spacing between VRMs 302 and without sacrificing functionality of the VRM. 302. FIGS. 5A and 5B illustrate cross-sectional views of a VRM 400 design for underfill in accordance with aspects of this disclosure, A layer of the VRM 400 closest to a BGA can have a larger recess than active layers of the VRM 400. Accordingly, the BGA can be protected by a sufficient clearance of the layer closest to the BGA and active layers of can maintain higher density with smaller recesses than the layer closest to the BGA.

With reference to FIG. 5A, the VRM 400 includes a first layer 402, a second layer 404, a third layer 406, and a BGA 408. The VRM 400 further includes a plurality of recesses 412 formed at corners of the VIM 400. The recesses 412 of a plurality of adjacent VRMs 400 may form a bolt hole, for example, as shown in FIG. 4C. The second and third layers 404 and 406, respectively, may include active components (e.g., silicon components such as transistors) configured to step down and/or repeat an input voltage to a voltage that can be used by the SoW 204. Accordingly, the second and third layers 404 and 406 can be referred to as active layers. In certain implementations, at least a portion of the second layer 404 and/or the third layer 406 may be implemented using an ASIC device to step down the input voltage, leading to limitations on the form factor of these layers 404 and 406. In particular, the use of ASIC devices may be limited to a certain footprint for second and third layers 404 and 406.

In one example, the VRM 400 can receive an input voltage of 48 V and provide an output at 0.8 V or a 1.1 V to the SoW 204. Any other suitable input and/or output voltages can be used depending on the implementation. Thus, the second and third layers 404 and 406 may be configured to function as a step-down transformer. In some implementations, the second and third layers 404 and 406 may include one or more current dividers and/or one or more current multipliers configured to step down the input voltage received by the VRM 400.

The first layer 402 may comprise a plurality of current multiplier components, which may be discrete components rather than the active components included in the second and third layers 104 and 406. The discrete components can be passive circuit elements. For instance, the discrete components of the first layer 402 can include as one or more resistors, one or more capacitors, one or more inductors, or any suitable combination thereof. There may be more flexibility in the placement of the discrete components than the active components, thereby enabling more flexibility in the layout design for the components of the first layer 402 compared to the second and third layers 404 and 406, With certain placements of the discrete components, the area of the first layer 402 can be reduced, Thus, the area of the first layer 402 can be reduced without significantly affecting the functionality of the VRM 400, FIG. 5B illustrates a magnified view of a portion 410 of the VRM 400 of FIG. 5A near the recess 412. With reference to FIG. 5B, by reducing the size of the first layer 402 without adjusting the size of the second and third layers 404 and 406, a step or notch 414 can be provided in the recess 412 to increase the size of the keep-out zone around the bolt adjacent to the BGA 408 without reducing the size of the second and third layers 404 and 406 that include active components. The recess in the first layer 402 has a larger footprint than the recesses in the second and third layers 404 and 406. The recess in the first layer 402 can provide a larger bolt clearance than the recesses in the second and third layers 404 and 406. Together, the notch 414 formed by the recess in the first layer 402 along with the recesses in the second and third layers 404 and 406 in adjacent VRMs 400 (e.g., see FIG. 4C) may form a counterbore. Thus, an underfill (e.g., see the underfill 502 illustrated in FIG. 6) can be provided to protect the BGA 408 and the increased size of the keep-out zone provided by the notch 414 in the first layer 402 can prevent the underfill from clogging the recess 412. In addition, since the underfill is applied to protect the BGA 408 adjacent to the first layer 402, the size of the second and third layers 404 and 406 can be maintained since there is little to no risk of the underfill reaching these layers 404 and 406. Accordingly, the size of the second and third layers 404 and 406 with active components can be maintained to ensure that the performance of the VRM 400 and density of the second and third layers 404 and 406 is maintained.

The underfill may form a fillet that extends from an edge of the first layer 402 towards the bolt. In some implementations, the distance that the fillet extends from the edge of the first layer 402 towards a center of a bolt hole formed by the recess 412 and similar recesses of neighboring VRMs is less than the distance between the clearance of the recess 412 at the second and third layers 404 and 406 and the clearance of the recess 412 at the first layer 402. That is, the fillet may not extend further towards the center of the bolt hole than the distance that the second and third layers 404 and 406 extend toward the center of the bolt hole. However, in some other embodiments, the fillet may extend further towards the bolt than the second and third layers 404 and 406.

Figure 6:
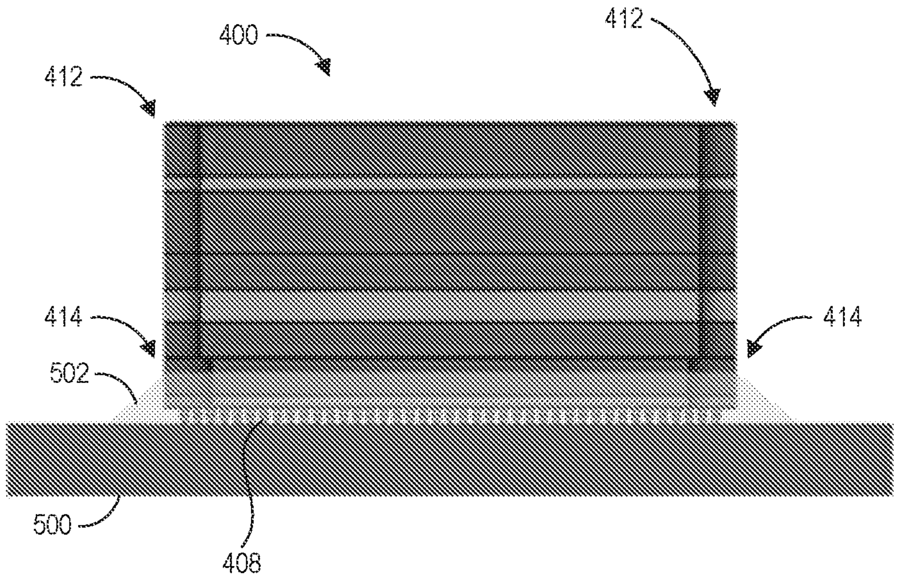
FIG. 6 illustrates a cross-sectional view of a VRM mounted to an ASIC in accordance with aspects of this disclosure.

FIG. 6 illustrates a cross-sectional view of a VRM 400 mounted to an ASIC 500 in accordance with aspects of this disclosure. As shown in FIG. 6, the VRM 400 includes a BGA 408 configured to provide a plurality of electrical connections between the VRM 400 and the ASIC 500. The BGA 408 is encapsulated by an underfill 502 which provides structural support to and physically protects the BGA 408. As shown in FIG. 6, the underfill 502 forms a fillet that extends along the ASIC 500 from edges of the VRM 400 towards a bolt hole formed by the recesses 412 at corners of the VRM 400. As described above, due to the presence of the notch 414, the fillet formed by the underfill 502 does not extend as far towards a center of the bolt hole as in a similar VRM which does not include the notch 414.

CONCLUSION

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed voltage regulating module design. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other. Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A voltage regulating module (VRM), comprising:

a first layer configured to output a regulated voltage that is based on a stepped down voltage, the first layer having a first recess;

a second layer stacked with the first layer, the second layer comprising a plurality of active components configured to receive a voltage, generate the stepped down voltage based on the voltage, and provide the stepped down voltage to the first layer, the second layer having a second recess that overlaps with the first recess, the first recess having a larger footprint than the second recess, the first and second recesses defining a curved opening that provides clearance for a fastener to be inserted through the curved opening; and a plurality of contacts on the first layer and configured to output the regulated voltage, wherein the plurality of contacts are encapsulated with an underfill, the underfill forming a fillet that extends from an edge of the first layer towards the fastener.

2. The VRM of claim 1, wherein the plurality of contacts includes a ball grid array.

3. The VRM of claim 1, further comprising a third layer stacked with the first and second layers, the third layer comprising plurality of active components.

4. The VRM of claim 3, wherein the third layer has a third recess having an area that is substantially the same as the area of the second recess.

5. The VRM of claim 1, wherein the first layer comprises a plurality of discrete components configured to multiply the current of the stepped down voltage.

6. The VRM of claim 5, wherein the discrete components comprise passive circuit elements.

7. A multi-chip module, comprising:

a plurality of integrated circuit (IC) dies;

a plurality of voltage regulating modules (VRMs), wherein each VRM of the VRMs is stacked with a respective IC die of the plurality of IC dies; and a plurality of fasteners located in curved openings between VRMs of the plurality of VRMs;

wherein a first VRM of the plurality of VRMs comprises:

a first layer configured to output a regulated voltage that is based on a stepped down voltage, the first layer having a first recess;

a second layer stacked with the first layer, the second layer comprising a plurality of active components configured to receive a voltage and provide the stepped down voltage to the first layer, the second layer having a second recess that overlaps with the first recess, the first layer having a larger clearance from a first fastener of the plurality of fasteners than the second layer, the first fastener being located in a first curved opening of the curved openings, the first curved opening being at least partly defined by the first recess and the second recess; and a plurality of contacts on the first layer and electrically connected to a first IC die of the plurality of IC dies that is stacked with the first VRM, the plurality of contacts configured to provide the regulated voltage to the first IC die, wherein the plurality of contacts are encapsulated with an underfill, the underfill forming a fillet that extends from an edge of the first layer towards the fastener.

8. The multi-chip module of claim 7, wherein the plurality of contacts includes a ball grid array.

9. The multi-chip module of claim 7, wherein the clearance of the first layer is configured to impede the underfill from clogging the first recess.

10. The multi-chip module of claim 7, wherein a distance that the fillet extends from the edge of the first layer towards the first fastener is less than a distance between the clearance of the first layer and the clearance of the second layer.

11. The multi-chip module of claim 7, wherein the first layer comprises a plurality of passive circuit elements configured to multiply the current of the stepped down voltage.

12. The multi-chip module of claim 7, wherein the plurality of fasteners comprise bolts.

13. The multi-chip module of claim 7, further comprising a cooling system configured to actively cool the VRMs.

14. The multi-chip module of claim 7, wherein a system on wafer (SoW) includes the IC dies.

15. The multi-chip module of claim 14, further comprising a thermal dissipation structure formed on a side of the SoW opposing the first and second layers.

* * * * *